(12) United States Patent
Yu et al.

(10) Patent No.: US 9,859,447 B2
(45) Date of Patent: Jan. 2, 2018

(54) DIODE DEVICE AND MANUFACTURING METHOD THEREOF

(71) Applicant: LITE-ON SEMICONDUCTOR CORP., New Taipei (TW)

(72) Inventors: Shih-Han Yu, Hsinchu (TW); Sung-Ying Tsai, Tainan (TW); Yu-Hung Chang, Hsinchu County (TW); Ju-Hsu Chuang, Nantou County (TW); Chih-Wei Hsu, Taipei (TW)

(73) Assignee: LITE-ON SEMICONDUCTOR CORP., New Taipei (TW)

( * ) Notice: Subject to any disclaimer, the term of this patent is extended or adjusted under 35 U.S.C. 154(b) by 0 days.

(21) Appl. No.: 15/090,966

(22) Filed: Apr. 5, 2016

(65) Prior Publication Data

US 2017/0148927 A1 May 25, 2017

(30) Foreign Application Priority Data

Nov. 20, 2015 (TW) .............................. 104138486 A (51) Int. Cl.
*H01L 29/872* (2006.01)
*H01L 21/265* (2006.01)
*H01L 29/06* (2006.01)
*H01L 29/47* (2006.01)
*H01L 29/66* (2006.01)

(52) U.S. Cl.
CPC .......... *H01L 29/872* (2013.01); *H01L 21/265* (2013.01); *H01L 29/0619* (2013.01); *H01L 29/0661* (2013.01); *H01L 29/47* (2013.01); *H01L 29/66143* (2013.01); *H01L 29/8725* (2013.01)

(58) Field of Classification Search
CPC ............. H01L 29/7813; H01L 29/7811; H01L 29/66734
See application file for complete search history.

(56) References Cited

U.S. PATENT DOCUMENTS 8,753,935 B1 * 6/2014 Bobde ............... H01L 29/66719
257/334
2004/0222458 A1 * 11/2004 Hsieh .................. H01L 29/7813
257/329

(Continued)

*Primary Examiner* — Marcos D Pizarro Crespo
*Assistant Examiner* — Shannon Yi
(74) *Attorney, Agent, or Firm* — Li & Cai Intellectual Property (USA) Office (57) ABSTRACT

A diode device and manufacturing method thereof are provided. The diode device includes a substrate, an epitaxial layer, a trench gate structure, a Schottky diode structure and a termination structure. An active region and a termination region are defined in the epitaxial layer. The Schottky diode structure and the trench gate structure are located in the active region and the termination structure is located in the termination region. The termination structure includes a termination trench formed in the epitaxial layer, a termination insulating layer, a first spacer, a second spacer and a first doped region. The termination insulating layer is conformingly formed on inner walls of the termination trench. The first and second spacers are disposed on two sidewalls of the termination trench. The first doped region formed beneath the termination trench has a conductive type reverse to that of the epitaxial layer.

18 Claims, 9 Drawing Sheets

(56) References Cited

U.S. PATENT DOCUMENTS

| | | | | |
|---|---|---|---|---|
| 2005/0062124 A1* | 3/2005 | Chiola | ............... | H01L 29/0661 |
| | | | | 257/476 |
| 2005/0189585 A1* | 9/2005 | Jones | ................. | H01L 29/0886 |
| | | | | 257/330 |
| 2005/0215011 A1* | 9/2005 | Darwish | ............ | H01L 29/7813 |
| | | | | 438/270 |
| 2007/0290234 A1* | 12/2007 | Wu | ................... | H01L 29/66143 |
| | | | | 257/212 |
| 2008/0035987 A1* | 2/2008 | Hebert | .............. | H01L 21/26586 |
| | | | | 257/330 |
| 2009/0065814 A1* | 3/2009 | Bhalla | ................ | H01L 29/1083 |
| | | | | 257/230 |
| 2013/0249043 A1* | 9/2013 | Kuo | ................... | H01L 29/0649 |
| | | | | 257/487 |
| 2015/0137220 A1* | 5/2015 | Li | .................... | H01L 21/76802 |
| | | | | 257/330 |
| 2015/0349091 A1* | 12/2015 | Yilmaz | ............ | H01L 29/66666 |
| | | | | 438/270 |

* cited by examiner

DIODE DEVICE AND MANUFACTURING METHOD THEREOF

BACKGROUND

1. Technical Field

The instant disclosure relates to a diode device and manufacturing method thereof, in particular, to a trench Schottky diode device for rectification and manufacturing method thereof.

2. Description of Related Art

Different from common PN diodes, Schottky diodes utilize the Schottky barrier generated during the bonding of metals and semiconductors, thereby providing the function of rectification. A Schottky diode has a low forward voltage drop and a very fast switching action. In addition, a Schottky diode may afford larger forward current and may block reverse bias current. Therefore, Schottky diodes are semiconductor elements with low power, high current and super-high speed.

Accordingly, Schottky diodes are an important power element and are widely used as output rectifying diodes in switches of power supplies, motor controllers, switches of communication elements, automatic equipment in factories, electronic automatic applications and other applications for high speed power switches.

However, since the reverse breakdown voltage of the Schottky diode is low, the Schottky diode has larger current leakage under reverse bias. When the reverse bias is larger than the reverse breakdown voltage of the Schottky diode, the reverse current will pass through the Schottky diode and may increase the temperature thereof and lead to a thermal instability issue. In addition, since the complication of the manufacturing process of the Schottky diode is high, the Schottky diode has a high manufacturing cost.

SUMMARY

The instant disclosure provides a diode device and manufacturing method thereof for increasing the reverse breakdown voltage of the Schottky diode and reducing the reverse current leakage of the Schottky diode. By increasing the reverse breakdown voltage of the Schottky diode, it can employ Schottky metals with lower barrier and hence, is able to further decrease the turn on voltage of the Schottky diode.

An embodiment of the instant disclosure provides a diode device comprising a substrate, an epitaxial layer, a trench gate electrode structure, a Schottky diode structure and a termination structure. The epitaxial layer is disposed on the substrate, wherein the epitaxial layer defines an active region and a termination region adjacent to the active region. The Schottky diode structure and the trench gate structure both locate in the active region, and the termination structure locates in the termination region. The termination structure comprises a termination trench, a termination insulating layer, a first spacer, a second spacer and a first doped region. The termination trench forms in the epitaxial layer, wherein an inner wall of the termination trench comprises a first sidewall adjacent to the active region and a second sidewall opposite to the first sidewall and far from the active region. The termination insulating layer conformingly forms on the inner wall of the termination trench. The first spacer locates in the termination trench and stacks on the termination insulating layer, wherein the first spacer is immediately adjacent to the first sidewall. The second spacer locates in the termination trench and stacks on the termination insulating layer, wherein the second spacer is immediately adjacent to the second sidewall. The first doped region forms in the termination region and is beneath the termination structure, wherein the first doped region has a conductive type reverse to that of the epitaxial layer.

Another embodiment of the instant disclosure provides a manufacturing method of a diode device comprising providing a substrate; forming an epitaxial layer on the substrate, wherein the epitaxial layer defines an active region and a termination region surrounding the active region; performing an etching step for forming a trench in the active region and a termination trench in the termination region of the epitaxial layer, wherein the width of the termination trench is larger than that of the trench, and the trench defines at least a platform in the active region, wherein an inner wall of the termination trench comprises a bottom surface, a first sidewall and a second sidewall opposite to the first sidewall; performing a first doping step in the epitaxial layer for forming a doped region in the epitaxial layer beneath the termination trench, wherein the doped region has a conductive type reverse to that of the epitaxial layer; forming a dielectric layer for covering an inner wall of the trench, a top surface of the platform and the inner wall of the termination trench, wherein the inner wall of the termination trench comprises a bottom surface and two sidewalls; forming a gate electrode in the trench and forming a first sidewall spacer structure and a second sidewall spacer structure on the first sidewall and the second sidewall of the termination trench respectively; forming a hard mask layer for covering the active region and a part of the first sidewall spacer structure; performing a second thermal oxidation process for forming a bottom oxidation layer at a bottom of the termination trench and extending the doped region to form a first doped region, wherein the thickness of the bottom oxidation layer decreases from the center toward two opposite ends; removing the hard mask and a part of the dielectric layer located on the top surface of the platform for forming a gate dielectric layer and a termination layer in the trench and the termination trench respectively; and forming a metal layer in the active region, wherein the metal layer is electrically connected to the gate electrode and contacts the top surface of the platform for forming a Schottky contact.

In sum, by forming a doped region having conductive type reverse to that of the epitaxial layer in the epitaxial layer beneath the termination trench, the diode device and manufacturing method thereof provided by the instant disclosure changes the electric field distribution, increasing the reverse breakdown voltage of the Schottky diode and reducing the reverse current.

In order to further understand the techniques, means and effects of the instant disclosure, the following detailed descriptions and appended drawings are hereby referred to, such that, and through which, the purposes, features and aspects of the instant disclosure can be thoroughly and concretely appreciated; however, the appended drawings are merely provided for reference and illustration, without any intention to be used for limiting the instant disclosure.

BRIEF DESCRIPTION OF THE DRAWINGS

The accompanying drawings are included to provide a further understanding of the instant disclosure, and are incorporated in and constitute a part of this specification. The drawings illustrate exemplary embodiments of the instant disclosure and, together with the description, serve to explain the principles of the instant disclosure.

DESCRIPTION OF THE EXEMPLARY EMBODIMENTS

Reference will now be made in detail to the exemplary embodiments of the instant disclosure, examples of which are illustrated in the accompanying drawings. Wherever possible, the same reference numbers are used in the drawings and the description to refer to the same or like parts.

Figure 1A:
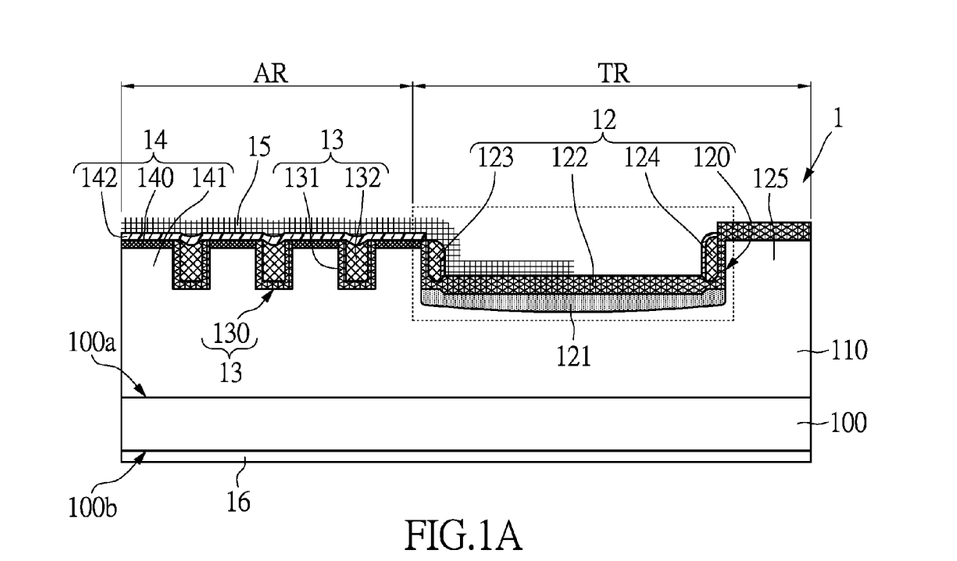
FIG. 1A is a sectional schematic view of the diode device of an embodiment of the instant disclosure.

FIG. 1A is a sectional schematic view of the diode device of an embodiment of the instant disclosure. The diode device 1 of the embodiment of the instant disclosure comprises a substrate 100, an epitaxial layer 110, a termination structure 12, a trench gate electrode structure 13, a Schottky diode structure 14, a first contact pad 15 and a second contact pad 16.

As shown in FIG. 1A, the substrate 100 is a semiconductor substrate and has a high concentration of a first type conductive dopant, thereby forming a first heavily doped region. The first heavy doped region may be distributed in a partial region of the substrate 100, or the entire substrate 100. The instant disclosure is not limited thereto.

The first conductive dopant may be an N-type or P-type conductive dopant. If the substrate 100 is a silicon substrate, the N-type conductive dopant is a pentavalent ion such as phosphor ion or arsenic ion, and the P-type conductive dopant is a trivalent ion such as boron ion, aluminum ion or gallium ion.

In addition, the substrate 100 has an upper surface 100a and a backside surface 100b opposite to the upper surface 100a. The epitaxial layer 110 is located on the upper surface 100a of the substrate 100 and has a low concentration of a first conductive dopant. In the present embodiment, the substrate is heavily N-doped ($N^+$), and the epitaxial layer 110 is lightly N-doped ($N^-$). In addition, in the present embodiment, an active region AR and a termination region TR opposite to the active region AR is defined in the epitaxial layer 110. Furthermore, the termination region TR surrounds the active region AR.

The trench gate structure 13 and the Schottky diode 14 are located in the active region AR, and the termination structure 12 is located in the termination region TR. To be specific, the termination structure 12 comprises a termination trench 120, a termination insulating layer 122, a first spacer 123, a second spacer 124 and a first doped region 121.

The termination trench 120 is formed in the epitaxial layer 110, and the width of the termination trench 120 is from 15 μm to 40 μm, and the depth of the termination trench 120 is from 1 μm to 5 μm. In addition, since the termination trench 120 is formed by recessing the surface of the epitaxial layer 110, there is a termination platform 125 defined in the termination region TR.

In addition, the inner wall of the termination trench 120 comprises a first sidewall S1 relatively close to the active region AR and a second sidewall S2 relatively far from the active region AR, wherein the first sidewall S1 is opposite to the second sidewall S2.

The first doped region 121 is located in the epitaxial layer 110 beneath the termination trench 120. Specifically, the first doped region 121 is immediately adjacent to the bottom of the termination trench 120. The first doped region 121 and the epitaxial layer 110 have conductive types reverse to each other to increase the reverse breakdown voltage of the diode device 1. To be specific, by forming the first doped region 121 having a conductive type reverse to that of the epitaxial layer 110 beneath the termination trench 120, the electric field distribution can be changed and the extension of the electric field increased, thereby increasing the reverse breakdown voltage of the diode device 1. After running stimulation tests, it has been demonstrated that the design of the first doped region 121 can increase the reverse breakdown voltage of the diode device 1 by 10%. In an embodiment, the epitaxial layer 110 is doped with an n-type conductive dopant, and the first doped region 121 is doped with a p-type dopant.

The termination insulating layer 122 conformingly forms on the inner wall of the termination trench 120 and the top surface of the termination platform 125 (i.e., the surface of the epitaxial layer 110 in the termination region TR). The part of the termination insulating layer 122 that covers the inner wall of the termination trench 120 has substantially the same profile as the termination trench 120. In an embodiment, the termination insulating layer 122 is an oxidation layer such as a silicon oxide layer.

Figure 1B:
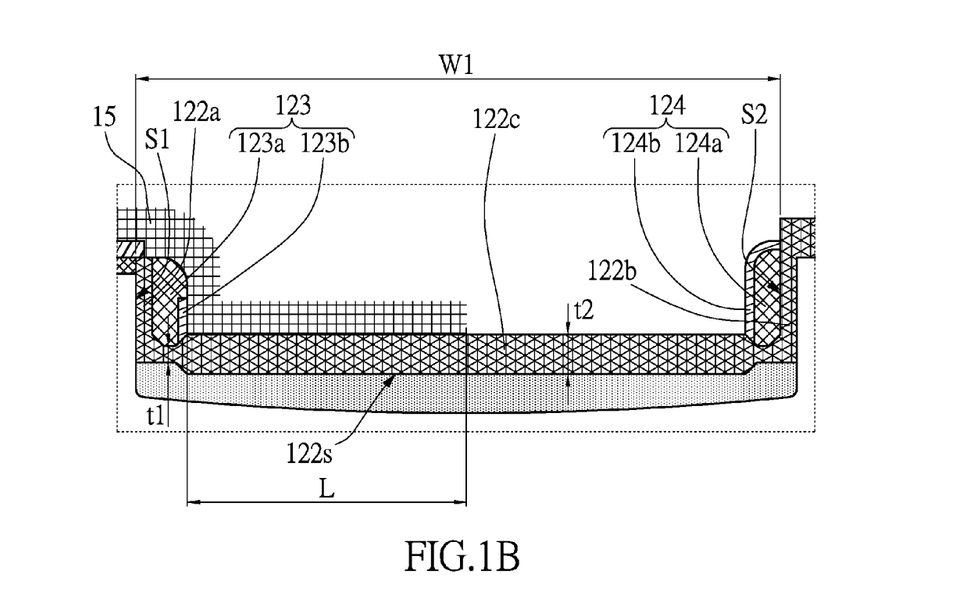
FIG. 1B is a partial enlargement of the termination structure shown in FIG. 1A.

Please refer to FIG. 1B. FIG. 1B shows the partial enlargement of the termination structure shown in FIG. 1A. In the present embodiment, the termination insulating layer 122 may be a thermal oxidation layer formed by a two-step thermal oxidation process. The termination insulating layer 122 formed by the two-step thermal oxidation process comprises sidewall oxidation layers 122a, 122b located at a first sidewall S1 and a second sidewall S2 of the termination trench 120, and a bottom oxidation layer 122c located at the bottom of the termination trench 120. The detailed process for forming the termination structure 12 will be described below.

Please refer to FIG. 1B. FIG. 1B depicts the partial enlargement of part A in FIG. 1A. It is worthwhile to mention that the thickness of the bottom oxidation layer 122c formed in the bottom of the termination trench 120 is not uniform. To be specific, in an embodiment, the bottom oxidation layer 122c adjacent to the first sidewall S1 and the second sidewall S2 has a first thickness t1, and the bottom oxidation layer 122c located at the center of the termination trench 120 has a second thickness t2, and the first thickness t1 is smaller than the second thickness t2. The thickness of the bottom oxidation layer 122c decreases from the center toward two opposite sides. In addition, the lower surface 122s of the bottom oxidation layer 122c is a curved surface.

Please refer to FIG. 1A. The first spacer 123 and the second spacer 124 are both located in the termination trench 120 and are stacked on the termination insulating layer 122. In addition, the first spacer 123 and the second spacer 124 are immediately adjacent to the first sidewall S1 and the second sidewall S2 respectively, and are disposed opposite to each other. Therefore, the first spacer 123 is relatively close to the active region AR, and the second spacer 124 is relatively far from the active region AR.

In the present embodiment, the first spacer 123 has a first semiconductor layer 123a and a first insulation layer 123b formed on the surface of the first semiconductor layer 123a. In addition, it is worthwhile to mention that in the present embodiment, the first insulation layer 123b is an oxide formed by the oxidation of the first semiconductor layer 123a. In other words, if the first semiconductor layer 123a is a polysilicon layer, the first insulation layer 123b is a silicon oxide layer, and the first insulation layer may be formed on the surface of first semiconductor layer 123a by a thermal oxidation process. However, in another embodiment, the first insulation layer may be a dielectric material formed by other processes, and the instant disclosure is not limited thereto. In other embodiments, the first spacer may only have the first semiconductor layer 123a.

Please refer to FIG. 1B. In the present embodiment, the first insulation layer 123b of the first spacer 123 only forms on a part of the surface of the first semiconductor layer 123a. Specifically, the first insulation layer 123b only forms on the areas near to the bottom oxidation layer 122c.

Similar to the first spacer 123, the second spacer 124 has a second semiconductor layer 124a and a second insulation layer 124b formed on the second semiconductor layer 124a. In addition, the second insulation layer 124b may be an oxide layer formed by the oxidation of the second semiconductor layer 124a. Different from the first spacer 123, the second insulation layer 124b of the second spacer 124 completely covers the surface of the second semiconductor layer 124a.

Please refer to FIG. 1A. The trench gate structure 13 comprises at least a trench 130, a gate dielectric layer 131 and a gate electrode 132.

To be specific, the trench 130 forms in the epitaxial layer 110 and defines at least a platform 141 in the active region AR. In the present embodiment, the width of the trench 130 is smaller than the width of the termination trench 120, and the depth of the trench 130 is smaller than the depth of the termination trench 120.

The gate dielectric layer 131 conformingly forms on the inner wall of the trench 130 and has a substantially the same profile as the trench 130. The material for constituting the gate dielectric layer 131 may be selected according to the actual needs and may be oxides, nitrides or other insulating materials, such as silicon oxides, aluminum oxides or silicon nitrides. The gate electrode 132 fills up the trench 130 and is electrically insulated from the epitaxial layer 110 through the gate dielectric layer 131. In the present embodiment, the gate 132 is a heavily doped polysilicon layer.

The Schottky diode structure 14 comprises the platform 141, a metal layer 142 and a second doped region 140. The second doped region 140 is formed at the top region of the platform 141, i.e., in the epitaxial layer, and surrounds the trench 130. The second doped region 140 has a conductive type reverse to that of the epitaxial layer 110. In other words, if the epitaxial layer 110 is doped with an n-type dopant, the second doped region 140 is doped with a p-type dopant. In an embodiment, the dose of the dopant in the second doped region 140 is from $10^{12}$ to $10^{14}$ cm$^{-2}$. In addition, in some embodiments, there is no second doped region formed on the top of the platform 141.

The metal layer 142 forms on the epitaxial layer 110 and is electrically connected to the gate electrode 132. To be specific, the metal layer 142 contacts the gate electrode 132 to establish an electrical connection and contact the top surface of the platform 141 to form a Schottky contact. In an embodiment, the metal layer 142 may be formed by a material selected from the group consisting of titanium, platinum, tungsten, nickel, chromium, molybdenum, tin and metal silicates thereof.

A first contact pad 15 forms on the Schottky diode structure 14 and the trench gate structure 13 to serve as the anode of the diode device 1. Specifically, the first contact pad 15 is formed on the metal layer 142. In addition, the first contact pad 15 extends from the active region AR to the termination trench 120 in the termination region TR and covers the first spacer 123 and a part of the termination insulating layer 122.

Since the first semiconductor layer 123a in the first spacer 123 is only partially covered by the first insulation layer 123b, the first contact pad 15 electrically connects to the first semiconductor layer 123a in the first spacer 123. Therefore, when applying a reverse bias, since the first contact pad 15 and the first semiconductor layer 123a are electrically connected with each other, the electric field at the corners of the termination trench 120 can be soothing (relieving) and hence, the reverse breakdown voltage can be increased and thereby increasing the reliability of the device.

In addition, the overlapping length L of the first contact pad 15 and the bottom oxidation layer 122c is at least larger than ⅓ of the termination trench width W1. In a preferred embodiment, the overlapping length L of the first contact pad 15 and the bottom oxidation layer 122c is from about 10 μm to 20 μm, and the termination trench width W1 is from about 15 μm to 40 μm. A second contact pad 16 forms on the backside surface of the substrate 100 to serve as the cathode of the diode device 1.

Figure 2A:
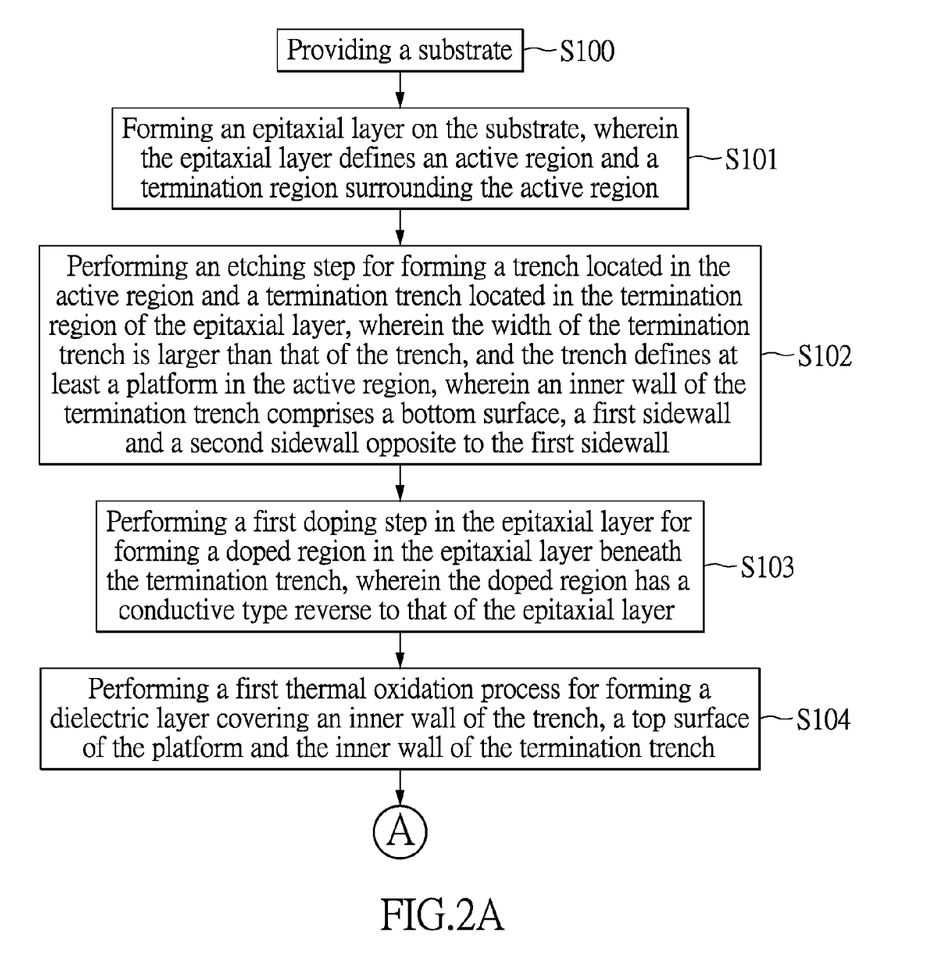
FIGS. 2A and 2B are a flowchart of the manufacturing method of the diode device of an embodiment of the instant disclosure.
Figure 2B:
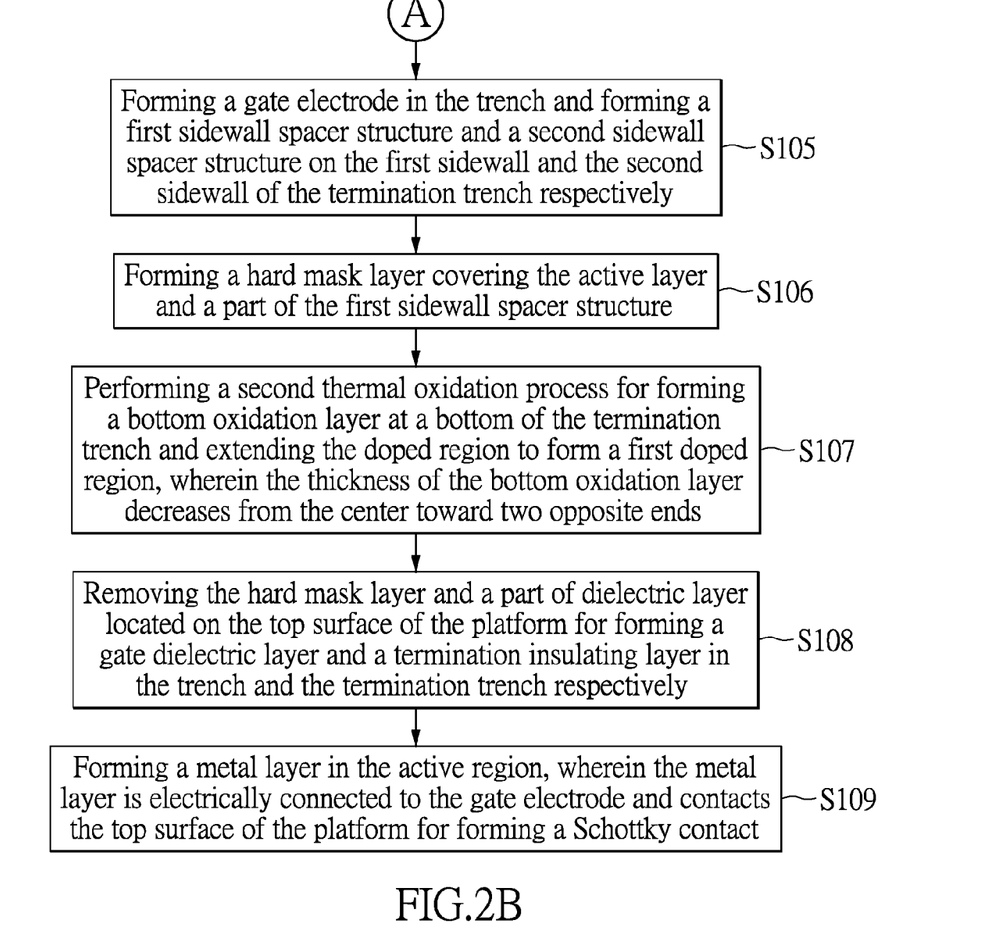

Please refer to FIGS. 2A and 2B. FIGS. 2A and 2B show the flowchart of the manufacturing method of the diode device of the embodiment of the instant disclosure. In addition, please refer to FIG. 3A to FIG. 3K which show the sectional schematic views of the diode device of the embodiment of the instant disclosure in each step.

Figure 3A:
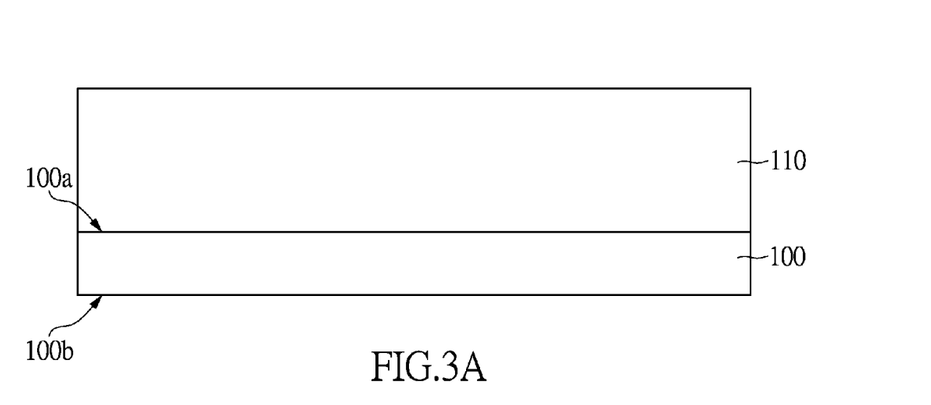
FIG. 3A to 3K are the sectional views of the diode device of an embodiment of the instant disclosure in each step.

First, in step S100, providing a substrate. Next, in step S101, forming an epitaxial layer on the substrate. Please refer to FIG. 3A. FIG. 3A depicts the substrate 100, and an epitaxial layer 110 is formed on the substrate 100, wherein the substrate is, for example, a silicon substrate and has high doping dose to form an ohmic contact with the electrode layer.

The epitaxial layer 110 has the same conductive type as the substrate 100. However, the epitaxial layer 110 has a smaller doping dose than the substrate 100. In addition, the epitaxial layer 110 has an active region AR and a termination region TR surrounding the active region AR defined thereon.

Please refer to FIG. 2A. In step S102, performing an etching step for forming a trench located in the active region and a termination trench located in the termination region, wherein the width of the termination trench is larger than that of the trench, and the trench defines at least a platform in the active region.

Figure 3B:
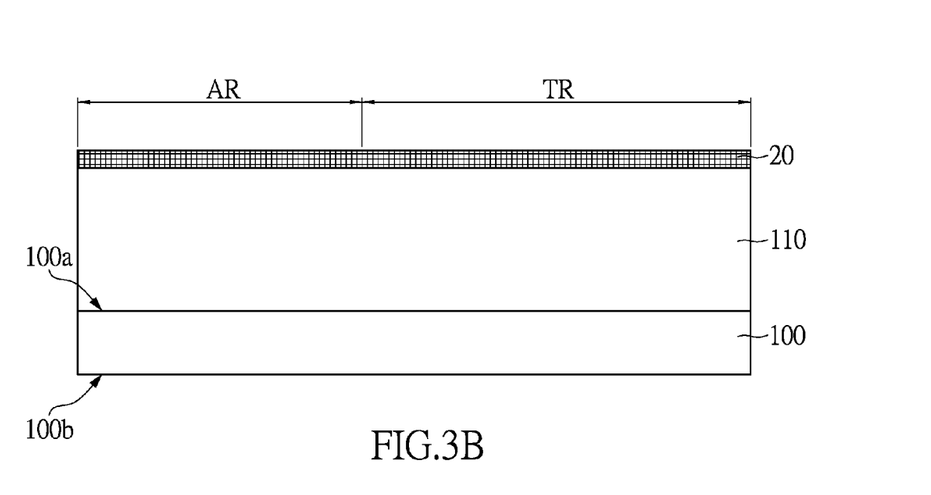
Figure 3C:
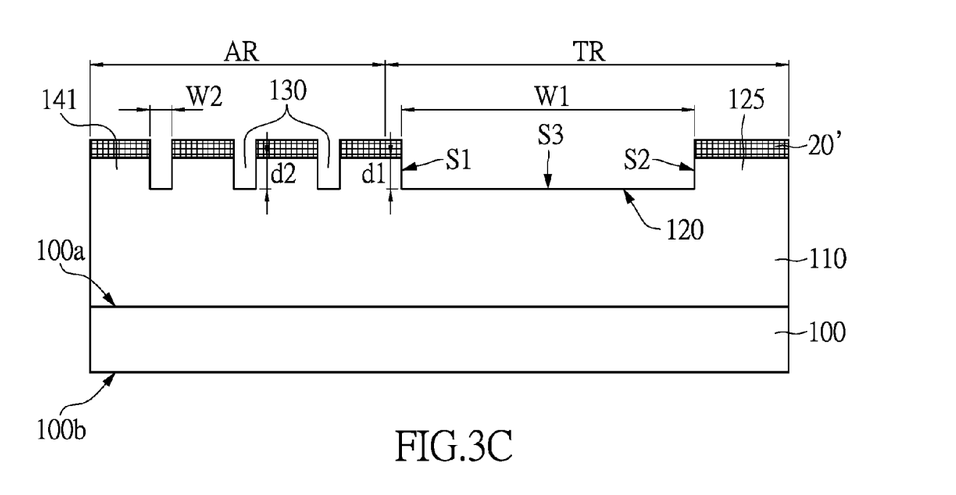

Please refer to FIG. 3B to FIG. 3C. FIG. 3B and FIG. 3C show the details of step S102. As shown in FIG. 3B, in the present embodiment, before performing the etching step, forming a mask layer 20 on the epitaxial layer 110, wherein the mask layer 20 is a silicon dioxide layer.

After a photolithography process, the mask layer 20 is patterned, and a mask patterning layer 20' is formed on the epitaxial layer 110. The mask patterning layer 20' has a plurality of openings for defining the position and dimension of the trench 130 and the termination trench 120. Afterward, as shown in FIG. 3C, performing the etching step for forming a trench 130 in the active region AR and a termination trench 120 in the termination region TR of the epitaxial layer 110. The width W1 of the termination trench 120 is larger than the width W2 of the trench 130, and the depth d1 of the termination trench 120 is smaller than the depth d2 of the trench 130. As mentioned above, the trench 130 defines a plurality of platform 141 in the active region AR, and the termination trench 120 defines the termination platform 125 in the termination region TR.

It is worthwhile to mention that the inner wall of the termination trench 120 comprises a first sidewall S1 relatively close to the active region AR, a second sidewall S2 relatively far from the active region AR and a bottom surface S3, wherein the bottom surface S3 connects between the first sidewall S1 and the second sidewall S2.

Please refer to FIG. 2A. In step S103, performing a doping step on the epitaxial layer for forming a doped region in the epitaxial layer beneath the termination trench, wherein the doped region has a conductive type reverse to that of the epitaxial layer.

Figure 3D:
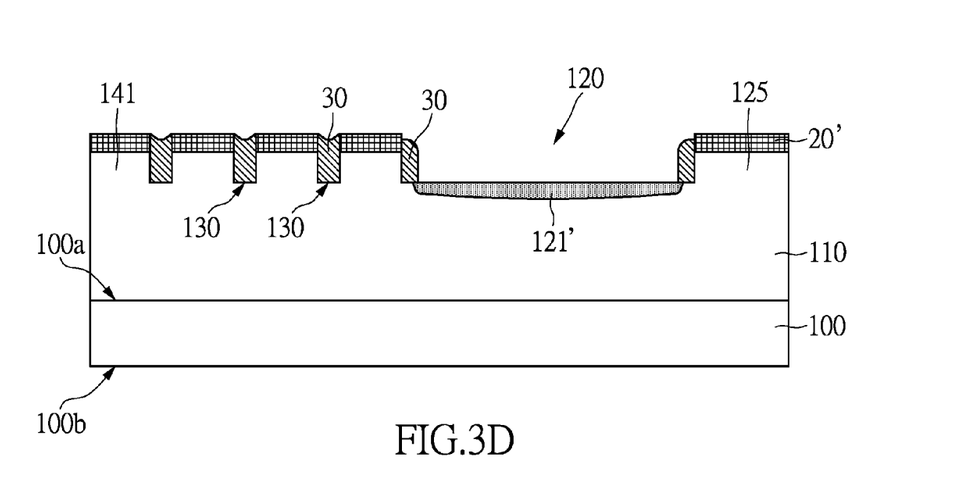

Please refer to FIG. 3D, in the present embodiment, after performing step S102 and before performing step S103, forming an oxidation layer 30 for filling the trench 130, and forming a spacer between the first sidewall S1 and the second sidewall S2 of the termination trench 120. The oxidation layer 30 may be a TEOS oxidation layer formed by tetraethyl orthosilicate (TEOS).

To be specific, blanketly forming the TEOS oxidation layer on the platform 141, the inner wall of the trench 130, the termination platform 125 and the inner wall of the termination trench 120. Afterward, removing a part of the TEOS oxidation layer by etch back technique to expose the bottom surface S3 of the termination trench 120.

Subsequently, performing a first doping step for forming a doped region 121' beneath the termination trench 120, wherein the doped region 121' has a conductive type reverse to that of the epitaxial layer 110.

In the present embodiment, the doping step is performed by ion implantation to dope the epitaxial layer 110 beneath the bottom surface S3 of the termination trench 120. It is worthwhile to mention that during the ion implantation process, the oxidation layer 30 and the mask patterning layer 20' may both be used as the ion implantation mask. Furthermore, by forming the oxidation layer 30 on the first sidewall S1 and the second sidewall S2 of the termination trench 120 in advance, it is able to prevent the dopant from entering the active region AR through the first sidewall S1 of the termination trench 120 during the ion implantation process and affecting the performance of the final product of the diode device. Subsequently, completely removing the oxidation layer 30 and the mask patterning layer 20'.

Please refer to FIG. 2A. In step S104, performing a first thermal oxidation process for forming a dielectric layer covering the inner wall of the trench, the top surface of the platform and the inner wall of the termination trench. Next, in step S105, forming a gate electrode in the trench and forming a first sidewall spacer structure and a second sidewall spacer structure on the first sidewall and the second sidewall respectively.

Figure 3E:
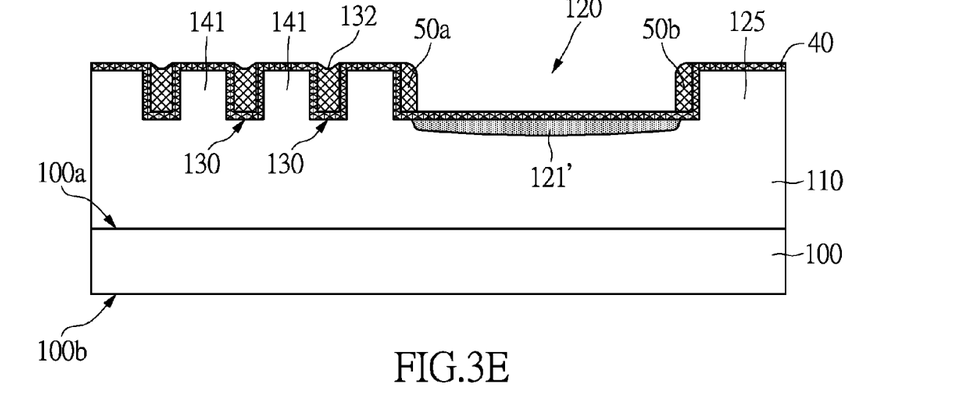

As shown in FIG. 3E, the dielectric layer 40 conformingly covers the top surface of the platform 141, the inner wall of the trench 130, the inner wall of the termination trench 120 and the top surface of the termination platform 125. The dielectric layer 40 may be an oxidation layer and may be formed by a thermal oxidation process. In an embodiment, the thickness of the dielectric layer 40 is from 20 nm to 500 nm.

After removing the oxidation layer 30 and the mask patterning layer 20', the manufacturing method provided by the embodiment of the instant disclosure may further comprise forming a sacrificial oxidation layer on the inner wall of the trench 130 before forming the dielectric layer 40, and then removing the sacrificial oxidation layer to reduce the defect on the inner wall of the trench 130.

Next, blanketly forming a heavily-doped semiconductor layer to fill up the trench 130 and cover the top surface of the platform 141, the top surface of the termination platform and the inner wall (not shown) of the termination trench 120. The process for forming the heavily-doped semiconductor layer may employ any known means and the instant disclosure is not limited thereto. Next, as shown in FIG. 3E, after removing a part of the heavily-doped semiconductor layer on the top surface of the platform 141, the top surface of the termination platform 125 and the bottom surface S3 of the termination trench 120 by an etch back process, the heavily-doped semiconductor layer remaining in the trench 130 forms a gate electrode 132, and the heavily-doped semiconductor layer covering the first sidewall S1 and the second sidewall S2 of the termination trench 120 form the first sidewall spacer structure 50a and the second sidewall spacer structure 50b respectively.

Figure 3F:
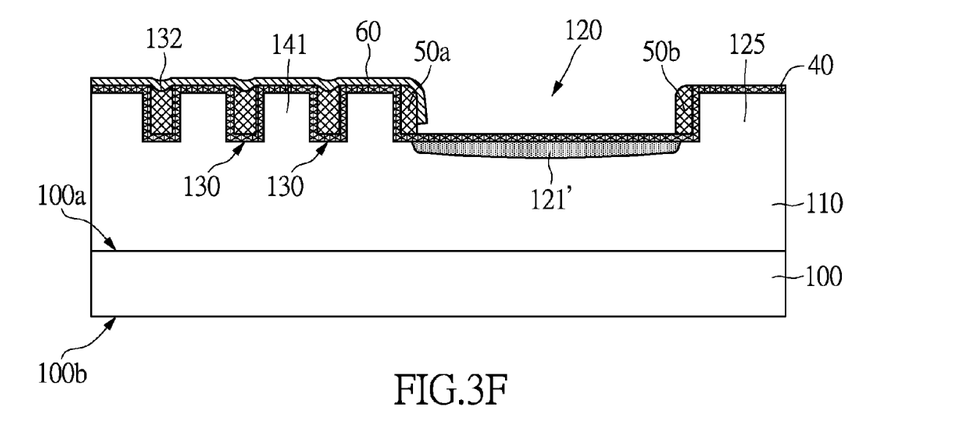

Please refer to FIG. 2B. In step S106, a hard mask layer covers the active region AR and extends from the active region AR to the termination region TR to cover a part of the first sidewall spacer structure 50a. The hard mask layer 60 may be used to protect the gate electrode 132 and the first sidewall spacer structure 50a, thereby preventing the surfaces of the gate electrode 132 and the first sidewall spacer structure 50a being completely oxidized during the following thermal oxidation process. In an embodiment, the hard mask layer 60 may be formed by a material such as silicon nitride layer.

Please refer to FIG. 2B. In step S107, performing a second thermal oxidation process for forming a bottom oxidation layer on the bottom of the termination trench, and extending the doped region for forming a first doped region, wherein the thickness of the bottom oxidation layer decreases from the center to the two ends.

Figure 3G:
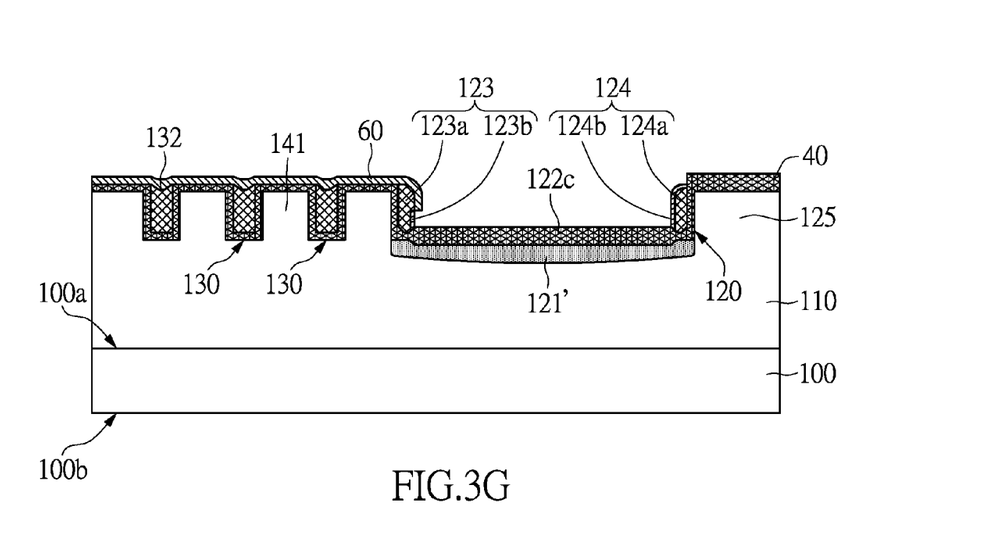
Figure 3H:
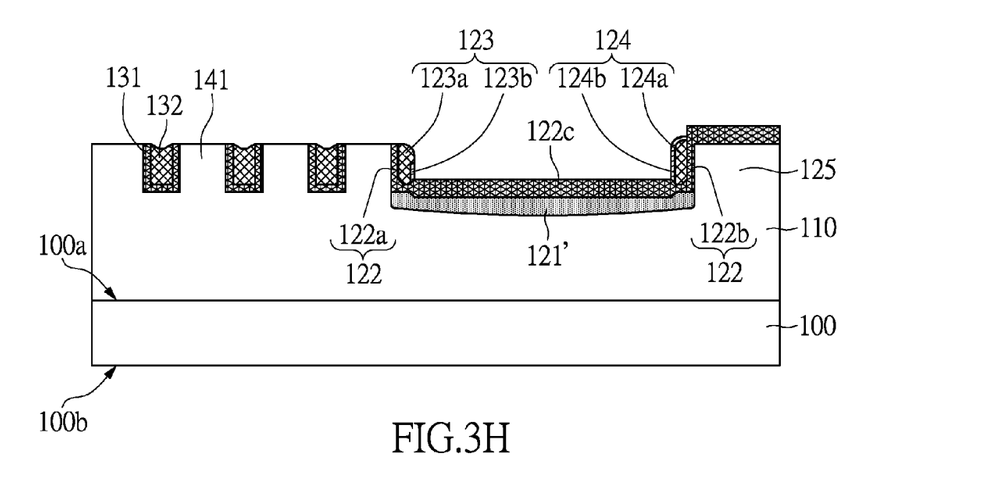

Please refer to FIG. 3G. Specifically, during the second thermal oxidation process, the thickness of the part of dielectric layer 40 formed on the bottom surface S3 of the termination trench 120 and not covered by the first sidewall spacer structure 50a and the second sidewall spacer structure 50b continues to increase, and the part of the dielectric layer 40 covered by the first sidewall spacer structure 50a and the second sidewall spacer structure 50b does not change substantially. Therefore, the thickness of the bottom oxidation layer 122c decreases from the center to the two ends.

Furthermore, the bottom oxidation layers 122c close to the first sidewall S1 and the second sidewall S2 have a first thickness t1, and the bottom oxidation layer 122c located at the center has a second thickness t2, wherein the first thickness t1 is smaller than the second thickness t2. In addition, the lower surface of the bottom oxidation layer 122c is a curved surface as shown in FIG. 1B.

In addition, regarding the first sidewall spacer structure 50a, the part of the surface not covered by the hard mask layer 60, i.e., the part of the surface close to the bottom of the termination trench 120, will be oxidized during the second thermal oxidation process, thereby forming the first spacer 123 shown in FIG. 3G. Similarly, during the second thermal oxidation process, the surface of the second sidewall spacer structure 50b that is not covered by the hard mask layer 60 will be oxidized, thereby forming the second spacer 124 as shown in FIG. 3G. Besides, the thickness of the dielectric layer 40 on the termination platform 125 will increase during the second thermal oxidation process.

In addition, while performing the second thermal oxidation process, in the epitaxial layer 11, the dopant in the doped region 121' diffuses toward the substrate 100, and at last forms a first doped region 121. Since the first doped region 121 and the epitaxial layer 100 have conductive types that are reverse to each other, a PN junction will form in the epitaxial layer 110, thereby forming a depletion region to change the electric field distribution of the diode device 1, thereby increasing the breakdown voltage of the diode device. Please continue to refer to FIG. 2B. In step S108, removing the hard mask layer and a part of the dielectric layer located on the top surface of the platform. Please refer to FIG. 3H at the same time. After removing the hard mask layer 60 and the part of the dielectric layer 40 located on the top surface of the platform, forming a gate dielectric layer 131 in the trench 130 and forming a termination insulating layer 122 in the termination trench 120, wherein the termination insulating layer 122 comprises the sidewall oxidation layers 122a, 122b located on the first sidewall S1 and the second sidewall S2 of the termination trench 120, and the bottom oxidation layer 122c located on the bottom of the termination trench 120. In an embodiment, the first thickness t1 of the bottom oxidation layer 122c close to the first sidewall S1 is from 20 nm to 500 nm, and the second thickness t2 of the bottom oxidation layer 122c at the center may be from 350 nm to 2000 nm.

Figure 3I:
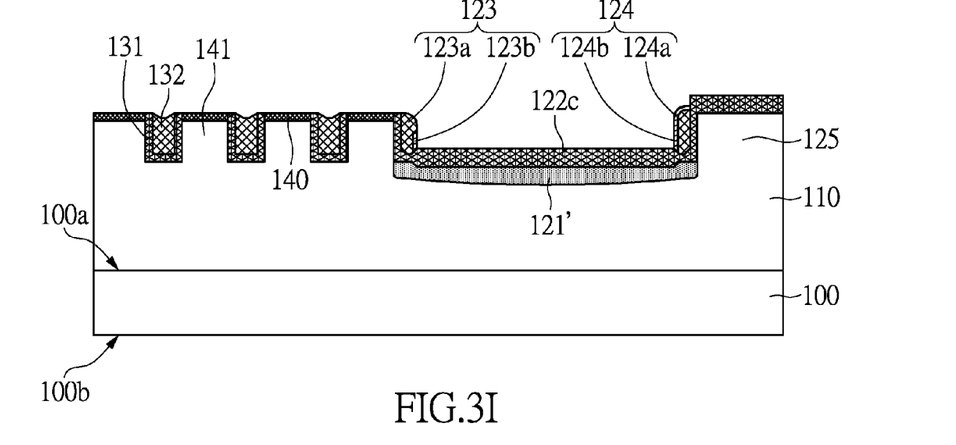

Next, please refer to FIG. 3I. The manufacturing method for the diode device provided by the embodiment of the instant disclosure may further comprise performing a second doping step to form a second doped region 140 on the top of the platform 141, wherein the second doped region 140 has a conductive type reverse to that of the epitaxial layer 110. Specifically, an ion implantation process may be employed to dope the top region of the platform 141, and a thermal drive in process may then be employed to diffuse the dopant to form the second doped region 140. The above thermal drive in process is performed in nitrogen gas and under elevated temperature to more than 800° C. for 30 to 60 minutes to diffuse the dopant. In another embodiment, the second doping step may be omitted. The doping dose of the second doped region 140 is from about $10^{12}$ to $10^{14}$ cm$^{-2}$.

Please refer to FIG. 2B. In step S109, forming a metal layer in the active region, wherein the metal layer is electrically connected to the gate electrode in the trench and contacts the top surface of the platform for forming a Schottky contact. Please refer to FIG. 3J, the metal layer 142 forms in the active region AR and establishes an electrical connection by contacting with the top surface of the gate electrode 132. Specifically, the metal layer 142 and the gate electrode 132 form an ohmic contact.

Figure 3J:
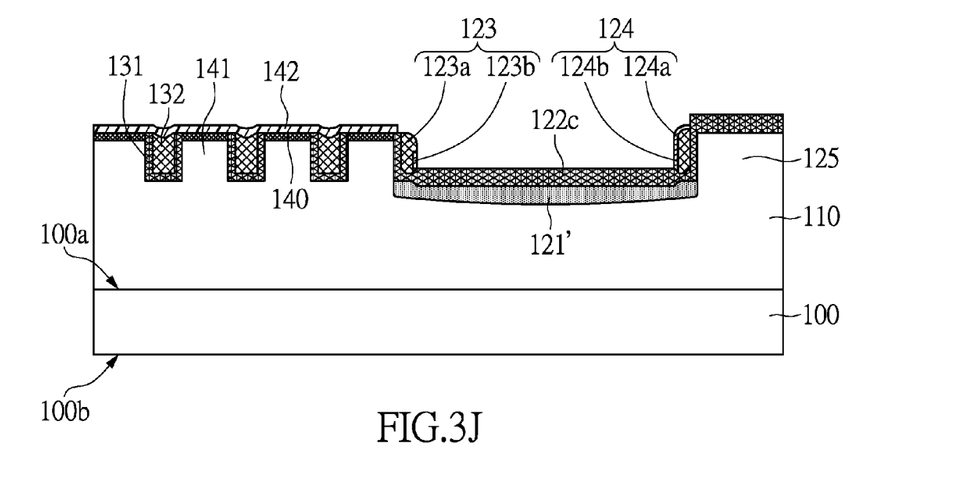

In addition, the metal layer 142 contacts the bottom surface of the platform 141 and forms a Schottky contact. The material that constitutes the metal layer may be formed by a material selected from the group consisting of titanium, platinum, tungsten, nickel, chromium, molybdenum, tin and the metal silicates thereof.

In an embodiment, a metal material layer is first blanketly formed on the entire surface of the epitaxial layer, then the metal material layer in the termination region TR is removed by etching, thereby forming the metal layer 142 covering the active region AR. In another embodiment, after forming the metal material layer on the entire surface of the epitaxial layer 110, performing a silicidation process to cause the metal material layer to react with the platform 141 for forming a metal silicate. Afterward, removing the unreacted metal material layer by selective etching.

Figure 3K:
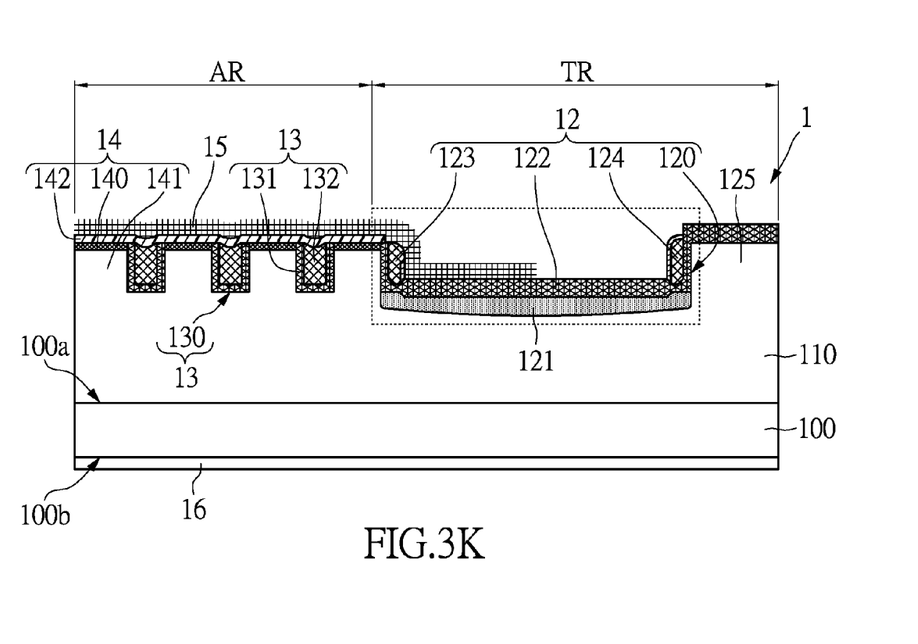

Next, please refer to FIG. 3K. The manufacturing method of the diode device provided by the embodiment of the instant disclosure further comprises forming a first contact pad 15 on the metal layer 142, and the first contact pad 15 is electrically connected to the metal layer 142 for forming a second contact pad 16 on the backside surface of the substrate 100.

The means for forming the first contact pad 15 and the second contact pad 16 may employ any technique well-known in the art, such as deposition, lithography and etching steps, and the instant disclosure is not limited thereto. The overlapping length L of the first contact pad 15 and the bottom oxidation layer 122c is at least larger than ⅕ of the termination trench width W1.

It is worthwhile to mention that since only a part of the first semiconductor layer 123a in the first spacer 123 is covered by the first insulation layer 123b, the first contact pad 15 is also electrically connected to the first semiconductor layer 123 in the first spacer 123. Therefore, when applying a reverse bias, since the first contact pad 15 is electrically connected to the first semiconductor layer 123a, the electric field at the corners of the termination trench 120 can be relieved, and the reverse breakdown voltage can be increased, thereby increasing the reliability of the device.

In sum, by forming a doped region having a conductive type reverse to that of the epitaxial layer in the epitaxial layer beneath the termination trench, the diode device and manufacturing method thereof provided by the instant disclosure may change the electric field distribution, thereby increasing the reverse breakdown voltage of the Schottky diode and reducing the reverse current leakage. Since the reverse current leakage is reduced, the metal layer in the Schottky diode structure may be selected as a material having lower on-resistance. In addition, the termination insulating layer is formed by a two-step thermal oxidation process and hence, is more dense and has better quality.

The above-mentioned descriptions represent merely the exemplary embodiment of the instant disclosure, without any intention to limit the scope of the instant disclosure thereto. Various equivalent changes, alterations or modifications based on the claims of instant disclosure are all consequently viewed as being embraced by the scope of the instant disclosure.

What is claimed is:

1. A diode device comprising:
   a substrate;
   an epitaxial layer disposed on the substrate, wherein the epitaxial layer defines an active region and a termination region adjacent to the active region;
   a trench gate structure located in the active region;
   a Schottky diode structure located in the active region; and
   a termination structure located in the termination region, wherein the termination structure comprises:
   a termination trench formed in the epitaxial layer, wherein an inner wall of the termination trench comprises a first sidewall adjacent to the active region and a second sidewall opposite to the first sidewall and far from the active region;
   a termination insulating layer conformingly covering the inner wall of the termination trench;
   a first spacer located in the termination trench and stacked on the termination insulating layer, wherein the first spacer is immediately adjacent to the first sidewall, the first spacer includes a first semiconductor layer and a first insulation layer, and a lower portion of a surface of the first semiconductor layer has a concave region receiving the first insulation layer;
   a second spacer located in the termination trench and stacked on the termination insulating layer, wherein the second spacer is immediately adjacent to the second sidewall; and a first doped region located in the epitaxial layer beneath the termination trench, wherein the first doped region has a conductive type reverse to a conductive type of the epitaxial layer.

2. The diode device according to claim 1, wherein the termination insulating layer has a bottom oxidation layer located at a bottom of the termination trench, wherein a thickness of the bottom oxidation layer adjacent to the first sidewall or the second sidewall is smaller than a thickness of the bottom oxidation layer in a center of the termination trench.

3. The diode device according to claim 1, wherein the termination insulating layer has a bottom oxidation layer located at a bottom of the termination trench, wherein a thickness of the bottom oxidation layer decreases from a center to two opposite ends.

4. The diode device according to claim 1, wherein the termination insulating layer has a bottom oxidation layer located at a bottom of the termination trench, wherein a lower surface of the bottom oxidation layer is a curved surface.

5. The diode device according to claim 1, wherein a first contact pad is formed on the Schottky structure and the trench gate structure and extends from the active region to the termination region, the termination insulating layer has a bottom oxidation layer located at a bottom of the termination trench, and an overlapping length of the first contact pad and the bottom oxidation layer is larger than $1/5$ of a width of the termination trench.

6. The diode device according to claim 1, wherein the second spacer comprises a second semiconductor layer and a second insulation layer formed on a surface of the second semiconductor layer, wherein the second insulation layer completely covers a surface of the second semiconductor layer.

7. The diode device according to claim 1, wherein the trench gate structure comprises:
at least a trench, wherein the trench is formed in the epitaxial layer;
a gate dielectric layer conformingly formed on an inner wall or the trench; and
a conductive layer filling the trench and electrically insulated from the epitaxial layer through the gate dielectric layer.

8. The diode device according to claim 1, further comprises:
a first contact pad formed on the Schottky structure and the trench gate structure, wherein the first contact pad extends from the active region to the termination region and covers the first spacer and a part of the termination insulating layer; and
a second contact pad disposed on a backside surface of the substrate.

9. The diode device according to claim 7, wherein a width of the trench is smaller than a width of the termination trench and a depth of the trench is smaller than a depth of the termination trench.

10. The diode device according to claim 7, wherein the Schottky diode structure comprises:
a platform defined by the trench formed in the epitaxial layer;
a second doped region formed in a top region of the platform, wherein the second doped region has a conductive type reverse to that of the epitaxial layer; and
a metal layer formed on the epitaxial layer, wherein the metal layer is electrically connected to the conductive layer and contacts a top surface of the platform to form a Schottky contact.

11. The diode device according to claim 10, wherein the metal layer is formed by a material selected from a group consisting of titanium, platinum, tungsten, nickel, chromium, molybdenum, tin and metal silicides thereof.

12. A manufacturing method of a diode device comprising:
providing a substrate;
forming an epitaxial layer on the substrate, wherein the epitaxial layer defines an active region and a termination region surrounding the active region;
performing an etching step for forming a trench located in the active region and a termination trench located in the termination region of the epitaxial layer, wherein a width of the termination trench is larger than a width of the trench, and the trench defines at least a platform in the active region, wherein an inner wall of the termination trench comprises a bottom surface, a first sidewall and a second sidewall opposite to the first sidewall;
performing a first doping step in the epitaxial layer for forming a doped region in the epitaxial layer beneath the termination trench, wherein the doped region has a conductive type reverse to a conductive type of the epitaxial layer;
performing a first thermal oxidation process for forming a dielectric layer covering an inner wall of the trench, a top surface of the platform and the inner wall of the termination trench;
forming a gate electrode in the trench and forming a first sidewall spacer structure and a second sidewall spacer structure on the first sidewall and the second sidewall of the termination trench respectively;
forming a hard mask layer covering the active region and a part of the first sidewall spacer structure;
performing a second thermal oxidation process for forming a bottom oxidation layer at a bottom of the termination trench and enlarging the doped region to form a first doped region, wherein the thickness of the bottom oxidation layer decreases from a center toward two opposite ends;
removing the hard mask layer and a part of the dielectric layer located on the top surface of the platform for forming a gate dielectric layer and a termination insulating layer in the trench and the termination trench respectively; and
forming a metal layer in the active region, wherein the metal layer is electrically connected to the gate electrode and contacts the top surface of the platform for forming a Schottky contact.

13. The manufacturing method according to claim 12, further comprises:
forming a mask patterning layer on the epitaxial layer before performing the etching step;
forming an oxidation layer for filling the trench and covering the first sidewall and the second sidewall after performing the etching step, wherein the oxidation layer exposes the bottom surface of the termination trench;
doping the epitaxial layer adjacent to the bottom surface through the oxidation layer and the mask patterning layer during performing the first doping step for forming the doped region; and removing the oxidation layer and the mask patterning layer before forming the dielectric layer.

14. The manufacturing method of claim 12, wherein after performing the second thermal oxidation process, surfaces of the part of the first sidewall spacer structure and a part of the second sidewall spacer structure are oxidized and a first spacer and a second spacer are formed.

15. The manufacturing method of claim 12, wherein the metal layer is formed by a material selected from a group consisting of titanium, platinum, tungsten, nickel, chromium, molybdenum, tin and metal silicide thereof.

16. The manufacturing method of claim 12, further comprises:
   forming a first contact pad on the metal layer, and the first contact pad is electrically connected to the metal layer; and
   forming a second contact layer on a backside surface of the substrate.

17. The manufacturing method of claim 12, further comprises:
   performing a second doping step for forming a second doped region on the top of the platform, wherein the second doped region has a conductive type reverse to that of the epitaxial layer.

18. The manufacturing method of claim 16, wherein the first contact pad extends from the active region to the termination region and covers the first spacer and a part of the bottom oxidation layer.

* * * * *